(12) United States Patent
Aktouf

(10) Patent No.: US 8,010,918 B2
(45) Date of Patent: Aug. 30, 2011

(54) METHOD FOR CREATING HDL DESCRIPTION FILES OF DIGITAL SYSTEMS, AND SYSTEMS OBTAINED

(75) Inventor: Chouki Aktouf, Romans (FR)

(73) Assignee: Institut National Polytechnique de Grenoble, Grenoble Cedex (FR)

( * ) Notice: Subject to any disclaimer, the term of this patent is extended or adjusted under 35 U.S.C. 154(b) by 710 days.

(21) Appl. No.: 10/589,137

(22) PCT Filed: Feb. 11, 2005

(86) PCT No.: PCT/FR2005/000323
§ 371 (c)(1),
(2), (4) Date: Aug. 7, 2008

(87) PCT Pub. No.: WO2005/083454
PCT Pub. Date: Sep. 9, 2005

(65) Prior Publication Data
US 2008/0295045 A1    Nov. 27, 2008

(30) Foreign Application Priority Data
Feb. 13, 2004 (FR) .................................. 04 01479
Aug. 30, 2004 (FR) .................................. 04 09181

(51) Int. Cl.
*G06F 17/50* (2006.01)

(52) U.S. Cl. .......................... 716/105; 716/104; 716/136

(58) Field of Classification Search ................... 716/4–6, 716/104, 105, 136
See application file for complete search history.

(56) References Cited

U.S. PATENT DOCUMENTS

| | | | | |
|---|---|---|---|---|
| 5,193,092 | A * | 3/1993 | Hartoog et al. | 714/732 |
| 5,508,937 | A * | 4/1996 | Abato et al. | 716/6 |
| 6,247,154 | B1 * | 6/2001 | Bushnell et al. | 714/733 |
| 6,256,759 | B1 * | 7/2001 | Bhawmik et al. | 714/726 |
| 6,256,770 | B1 | 7/2001 | Pierce et al. | |
| 6,301,688 | B1 * | 10/2001 | Roy | 716/4 |
| 6,639,442 | B1 * | 10/2003 | Ghameshlu et al. | 327/293 |
| 6,785,875 | B2 * | 8/2004 | Beerel et al. | 716/6 |
| 6,795,951 | B2 * | 9/2004 | Hathaway et al. | 716/5 |
| 7,131,081 | B2 * | 10/2006 | Wang et al. | 716/4 |
| 7,640,476 | B2 * | 12/2009 | Watkins et al. | 714/738 |
| 2001/0016862 | A1 * | 8/2001 | Saito et al. | 708/252 |
| 2003/0023941 | A1 | 1/2003 | Wang et al. | |
| 2003/0229834 | A1 * | 12/2003 | Cooke | 714/726 |
| 2007/0113127 | A1 * | 5/2007 | Nonaka | 714/724 |
| 2008/0092093 | A1 * | 4/2008 | Balakrishnan et al. | 716/4 |

OTHER PUBLICATIONS

Y. Huang et al., "On RTL Scan Design", ITC International Test Conference, Baltimore, Maryland, Oct. 30-Nov. 1, 2001, IEEE, US, pp. 728-737.
C. Aktouf et al., "Inserting Scan at the Behavioral Level", IEEE Design & Test of Computers, vol. 17, No. 3, Jul. 2000, pp. 34-42.

* cited by examiner

*Primary Examiner* — Jack Chiang
*Assistant Examiner* — Brandon W Bowers
(74) *Attorney, Agent, or Firm* — Clark & Brody

(57) ABSTRACT

The invention relates to a method comprising the following steps: HDL instruction sequences which are to be at the origin of memory elements during the synthesis of the system are automatically localized in the original HDL description files; and so-called SCAN HDL instructions are inserted into at least some of the HDL description files in an automatic sequential manner and without relational or functional analysis of the identified memory elements, ensuring that at least one so-called SCAN channel is obtained during the synthesis of the system, linking the memory elements.

19 Claims, 8 Drawing Sheets

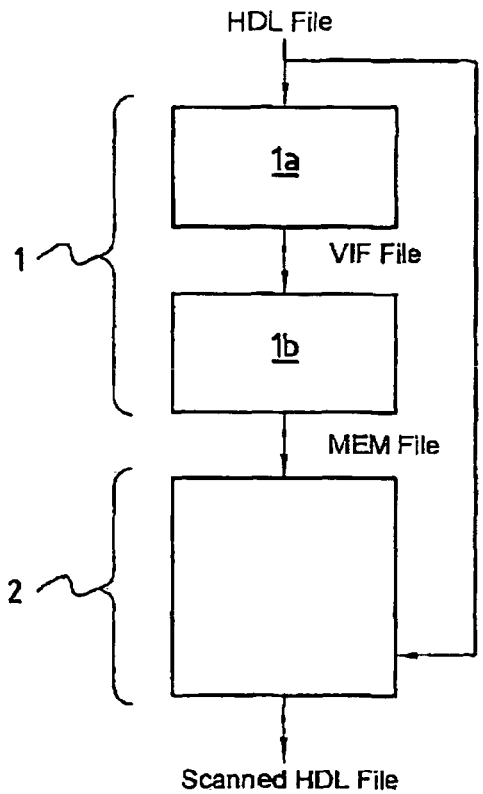

FIG.2 — HDL File

FIG.3

VIF File

```
// Example of Multiple Processes Verilog sans scan module example_4_processes (RESET, CLOCK, ENABLE, D_IN,
                A_Q_OUT, B_Q_OUT, C_Q_OUT, D_Q_OUT);

input RESET, CLOCK, ENABLE;
input       [7:0] D_IN;
output      [7:0] A_Q_OUT;
output      [7:0] B_Q_OUT;
output      [7:0] C_Q_OUT;
output      [7:0] D_Q_OUT;

reg         [7:0] A_Q_OUT;
reg         [7:0] B_Q_OUT;
reg         [7:0] C_Q_OUT;
reg         [7:0] D_Q_OUT;

// D flip-flop
    always @(posedge CLOCK)
    begin
        A_Q_OUT = D_IN;
    end // Flip-flop with asynchronous reset
    always @(posedge CLOCK)
    begin
        if (RESET)
            B_Q_OUT = 8'b00000000;
        else
            B_Q_OUT = D_IN;
    end // Flip-flop with asynchronous set
    always @(posedge CLOCK)
    begin
        if (RESET)
            C_Q_OUT = 8'b11111111;
        else
            C_Q_OUT = D_IN;
    end //Flip-flop with asynchronous reset & clock enable
    always @(posedge CLOCK)
    begin
        if (RESET)
            D_Q_OUT = 8'b00000000;
        else if (ENABLE)
            D_Q_OUT = D_IN;
    end endmodule
```

} HDL File

FIG.4

EOP

VIF File:

```
MODULE 5 example_4_processes ( A_Q_OUT B_Q_OUT CLOCK C_Q_OUT D_IN D_Q_OUT ENABLE RESET )
DECLARATION 7 INPUT $0:0$ ( CLOCK ENABLE RESET )
DECLARATION 8 INPUT $7:0$ ( D_IN )
DECLARATION 9 OUTPUT $7:0$ ( A_Q_OUT )
DECLARATION 10 OUTPUT $7:0$ ( B_Q_OUT )
DECLARATION 11 OUTPUT $7:0$ ( C_Q_OUT )
DECLARATION 12 OUTPUT $7:0$ ( D_Q_OUT )
DECLARATION 14 REG $7:0$ ( A_Q_OUT )
DECLARATION 15 REG $7:0$ ( B_Q_OUT )
DECLARATION 16 REG $7:0$ ( C_Q_OUT )
DECLARATION 17 REG $7:0$ ( D_Q_OUT )
PROCESS 20 ( CLOCK )
SINCRO_CLK 20 ( CLOCK )
INSTRUCTION 22 AFFECT ( A_Q_OUT ) AFFECTED_BY ( D_IN )
END PROCESS 23
PROCESS 26 ( CLOCK )
SINCRO_CLK 26 ( CLOCK )
BEGIN_SECV 28 CLOCK
INSTRUCTION 28 IF ( RESET )
INSTRUCTION 29 AFFECT ( B_Q_OUT ) AFFECTED_BY ( )
INSTRUCTION 30 ELSE
INSTRUCTION 31 AFFECT ( B_Q_OUT ) AFFECTED_BY ( D_IN )
END PROCESS 32
PROCESS 35 ( CLOCK )
SINCRO_CLK 35 ( CLOCK )
BEGIN_SECV 37 CLOCK
INSTRUCTION 37 IF ( RESET )
INSTRUCTION 38 AFFECT ( C_Q_OUT ) AFFECTED_BY ( )
INSTRUCTION 39 ELSE
INSTRUCTION 40 AFFECT ( C_Q_OUT ) AFFECTED_BY ( D_IN )
END PROCESS 41
PROCESS 44 ( CLOCK )
SINCRO_CLK 44 ( CLOCK )
BEGIN_SECV 46 CLOCK
INSTRUCTION 46 IF ( RESET )
INSTRUCTION 47 AFFECT ( D_Q_OUT ) AFFECTED_BY ( )
INSTRUCTION 48 ELSE
INSTRUCTION 48 IF ( ENABLE )
INSTRUCTION 49 AFFECT ( D_Q_OUT ) AFFECTED_BY ( D_IN )
END PROCESS 50
ENDMODULE 52 example_4_processes
```

FIG.5

Scanned HDL File

FIG.8

Scanned HDL File

FIG. 9

METHOD FOR CREATING HDL DESCRIPTION FILES OF DIGITAL SYSTEMS, AND SYSTEMS OBTAINED

This invention relates firstly to the technical domain of computer-aided design (CAD) of integrated digital electronic systems also called "electronic chips", and secondly the technical domain of the electronic chips obtained.

In general, the design of complex electronic systems to be integrated on the same electronic chip uses a phase in which a description of the integrated electronic system is generated in a so-called High level Description Language (HDL) at a so-called Register Transfer Level (RTL). The languages used most frequently to make such an HDL description are the Verilog or VHDL languages, although it must not be assumed that these are the only languages that can be used to produce an HDL description of a digital integrated electronic system at the RTL level.

The description of an integrated electronic system in HDL language is usually materialized in the form of a system of electronic files or description database that can then be composed of a single text file produced in an HDL language, or otherwise it may include several description text files, some of the files corresponding to the particular description of modules or parts of the integrated system, while other files describe the interaction and relations between the different modules and links existing between them.

To obtain a description of the electronic chip that could be qualified as physical with relation to the HDL language description that could be qualified as being functional or behavioral, a synthesis or compilation is made from the system of HDL description files using a computer tool usually called a silicon compiler that is used to obtain a hardware description at logic gates as a function of the selected technology, description also called a "netlist" that will then be used to obtain a physical representation of the integrated electronic system in the form of masks used for manufacturing the chip in accordance with the different known techniques that do not form part of the scope of this invention.

An integrated digital electronic system thus obtained must obviously enable guaranteed reliability and operation in accordance with the target set during its design.

Thus, it appeared necessary to provide systems or means for verifying perfect operation of an electronic system during its design, obviously in an automated manner, either using external devices that will be connected to the integrated electronic system once it has been manufactured, or using test systems forming an integral part of the integrated electronic system obtained.

In general, such an approach oriented towards testability of integrated electronic systems, is qualified as a DFT (Design For Test) technique: and more particularly the term BIST 'Built-in Self-test) is used when it is intended to build in its own automatic test means into the integrated electronic system.

A first approach to verify correct operation of the integrated digital electronic system consists firstly of verifying perfect operation of memory elements or flip-flops within the built-in system that will temporarily store intermediate processing results or signal values. This invention relates to local memory elements present within so-called sequential components. These sequential components represent most complex built-in circuits such as microprocessors or signal processing processors. Since a sequential circuit is composed of combinational logic elements and sequential elements or flip-flops, to be distinguished from memory elements of RAM or ROM memory modules.

Testing of sequential circuits includes a step to generate test patterns using special purpose software tools called ATPG for "Automatic Test Pattern Generators". The quality of the test patterns generated determines the test phase after manufacturing and the capacity of test patterns to reveal the presence of defects. The generation of quality test patterns requires the use of DFT techniques such as the SCAN. The "SCAN" technique consists of chaining the different memory elements to each other so as to obtain one or several SCAN chains that will be activated within the scope of operation of the integrated circuit in test mode.

Memory element SCAN and chaining functions can be put into place in the hardware description (netlist) of the integrated digital electronic circuit as described in U.S. Pat. No. 6,311,317. However, in particular, considering the very large number of logic gates, this insertion done automatically or semi-automatically requires a very long calculation time. Furthermore, this insertion can disturb operation of the integrated electronic logic system in normal mode, such that after elements have been chained at the netlist hardware description, it may be necessary to modify the design of the circuit and therefore to rewrite the description of the circuit in the HDL language, before making a new silicon compilation and a new insertion of the chaining of memory elements in the netlist.

This iterative process can be very long and consume hardware and human resources, and forms an obstacle to a reduction in the time necessary to design reliable and high performance integrated electronic systems.

Thus, it appeared that if SCAN functions can be integrated at the HDL description before the synthesis phase, it would be possible to substantially reduce the design time for the integrated electronic system.

Thus, another method has been proposed consisting of building in functions called chaining or SCAN functions at the RTL level, within the framework of the HDL description of the integrated digital electronic system.

For example, U.S. Pat. No. 6,256,770 proposed a method and device for implementing a test function of an integrated electronic system within the framework of its description in the HDL language. This patent firstly describes the assignment of portions of memory element chains to different modules in the circuit, followed by scheduling of these portions of memory element chains based on an analysis of functional relations existing between memory elements or data patterns in the HDL descriptions of modules. The next step based on this schedule is to insert chaining instructions in the description of the module concerned in the HDL language so that, during synthesis of the said module, the integrated digital electronic system incorporates the logical electronic circuits necessary for the test resulting from such chaining, for each module concerned.

Such a method and device enable automatic insertion of HDL instructions so that when the circuit is synthesized SCAN functions can be obtained so as to generate good quality test patterns for the integrated circuit under test.

However, in practice, it has been found that the step to analyse functional relations between the different data patterns, within the framework of the design of particularly complex integrated digital electronic systems, requires a particularly long calculation time such that the benefits of insertion of SCAN functions at the RTL level in the HDL language are reduced or even completely cancelled out due to the calculation time or calculation power necessary to make this insertion in accordance with U.S. Pat. No. 6,256,770.

Patent application US 2003/0023941 discloses another manner of automatically inserting instructions in the HDL language at the RTL, to implement SCAN functions in the integrated electronic system that will be obtained by a synthesis of the HDL description thus modified. According to this document, SCAN chains and test points are inserted in the HDL language at the RTL level firstly by analysing the testability of the description of the integrated electronic system in the HDL language.

Although the method described in US application 2003/0023941 does enable automatic insertion of HDL instructions corresponding to SCAN functions after synthesis, the testability analysis is a step that consumes large quantities of calculation resources or time such that the gains obtained due to automatic modification of the integrated electronic system at the HDL level are minimized due to the testability analysis calculation times.

Furthermore, US application 2003/0023941 also discloses how SCAN chains can be inserted by making an identification and an analysis of the different existing clock domains followed by a calculation to minimise test generation costs and to minimise clock domains. This analysis of clock domains and this minimisation also require large resources.

Therefore, there is a need for a method that automatically inserts SCAN functions within the framework of the HDL description at the RTL level of an integrated digital electronic system, to substantially reduce calculation times, while offering an integrated digital electronic system that, after synthesis, will have performances at least equivalent to the performances of integrated systems that would be synthesized, at RTL level, from HDL descriptions processed by methods according to prior art.

In order to achieve this purpose, the invention relates to a method for analysing a set of original description files for an integrated digital electronic system in a description language called the HDL language at the register transfer level, in order to automatically insert instructions in the HDL language into description files to obtain a new set of description files in the HDL language for the integrated digital electronic system including test functions such that during automatic synthesis of the integrated digital electronic system using a new set of HDL description files, the integrated digital electronic system obtained builds in at least some of the logical electronic circuits necessary to test operation of at least the memory elements.

According to the invention, the analysis and automatic insertion method is characterized in that it includes the following steps:

automatic localisation of HDL instructions or instruction sequences that during synthesis of the system, will be at the origin of the memory elements, in the original HDL description files;

automatic and sequential insertion in at least part of HDL description files, and without relational or functional analysis of the identified memory elements, of HDL instructions used to obtain firstly at least one so-called "SCAN" chain connecting the memory elements, and secondly means of implementing the so-called SCAN test of the circuit, during synthesis of the system.

According to the invention, the set of HDL description files of an integrated digital electronic system includes one or several text or ASCII code files that describe one, several or all functional modules of the integrated digital electronic system and any relations existing between the different modules, in HDL instructions. According to the invention, the HDL description of the integrated digital electronic system may also be described within the framework of a description database.

Similarly, for the purposes of the invention, all HDL instructions necessary to use the so-called SCAN test are inserted, namely particularly the insertion of instructions used to put the circuit to be tested into test mode, test signal input instructions, test signal output instructions, instructions for implementing a test clock, instructions for chaining memory elements and instructions for definition of a SCAN test controller, although this list cannot be considered to be exhaustive or exclusive of other functions that might be necessary for implementing the SCAN test.

The method according to the invention has the advantage that it does not require any large calculation resources due to the sequential insertion of element chaining instructions as they appear in HDL description pages (i.e. without analysing any relations between them) such that the method according to the invention can be used on a computer such as a personnel computer while resulting in shorter processing times than are necessary for using methods according to prior art.

The inventors have demonstrated that there was no need to carry out a relational or functional analysis, or even a testability analysis to insert HDL instructions necessary for implementing SCAN functions and that a sequential insertion of the said HDL instructions, that could be qualified as being a heuristic insertion, as these instructions that could generate memory elements appear in HDL description files, finally makes it possible to obtain all functions to test memory elements of the integrated digital electronic system without modifying performances or excessively increasing the surface area of these memory elements.

The invention also relates to an integrated digital electronic system resulting from the synthesis of a set of description files in the HDL language obtained by use of the method according to the invention and including at least part of the logical electronic circuits necessary to test at least operation of the memory elements such as one or several SCAN chains.

According to one characteristic of the invention, the analysis and automatic insertion method includes a step to record the new set of HDL description files obtained.

According to another characteristic of the invention, in order to prevent violations to SCAN rules during synthesis of the circuit using the new set of HDL description files, the analysis and automatic insertion method includes a step to identify the different existing clock domains, and the step to insert HDL memory element chaining instructions is then carried out so as to create at least one distinct SCAN chain for each clock domain.

Furthermore according to the invention, the dimension of variables or signals is determined before the step to insert HDL SCAN instructions so as to implement the SCAN at the RTL level that guarantees that SCAN rules will be respected during the synthesis. Thus for example, in the case of integer or enumeration type VHDL variables, the invention requires that the length of words corresponding to the number of bits should be fixed before VHDL SCAN instructions are inserted, so as to guarantee that elementary memories from which each memory is composed are correctly chained to each other.

Thus, according to another characteristic of the invention, the analysis and automatic insertion method:

includes a step to analyse or index all original HDL description files and to create at least one indexing file comprising the list of design units if there are any (entity, library, packet) for each HDL object and process, all declarations for each design unit, each declaration comprising the line number, the object name, its type, its size and the associated type of test construction, and the step to localise HDL instructions that will be at the origin of memory elements during synthesis of the circuit, includes a phase to create a memory localisation file comprising at least the name of the HDL object corresponding to each memory element, with its type, dimension and coordinates in the original HDL description files.

Furthermore, since information about the dimension of some variables could be missing in the set of original HDL description files, a preferred embodiment of the invention includes a step either for an automatic definition of this dimension based on a predetermined default value, or in which a user of the method makes the definition interactively.

Similarly, and according to a preferred variant embodiment, the method according to the invention checks compatibility between memory elements when HDL chaining instructions are inserted. In fact, it is only possible to chain memory elements corresponding to objects of the same type and with a compatible dimension. Thus, if there is an incompatibility, the invention includes a preferred but not strictly necessary method of inserting HDL chaining instructions including either a phase for automatic transformation of the type and/or dimension of one of the two objects at the origin of the conflict, or a phase in which the user interactively modifies the type and/or the dimension of one of the two objects at the origin of the conflict. Refer to patent application US 2003/0033595 for information about automatic detection and correction of such conflicts corresponding to syntax or grammatical errors in the use of the language.

According to another characteristic of the invention, the HDL instruction insertion step for chaining of memory elements includes:
a phase to insert HDL instructions for local chaining of memory elements at the set of HDL instructions corresponding to an HDL process so as to obtain at least one distinct chain of memory elements for each HDL process during the synthesis,
a phase to insert HDL chaining instructions, called global chaining, at the HDL description files, so as to obtain at least one chain of memory elements during the synthesis comprising the chains of memory elements created during the local chaining phase.

In general, the term chaining in the sequential domain is used for chaining within processes, while the term chaining in the concurrent domain is used for chaining external to processes.

Thus, according to another characteristic of the invention, the step for automatic insertion of HDL instructions includes the following phases:
insertion of HDL instructions corresponding to test signals used as an input-output port,
insertion of HDL instructions corresponding to intermediate work signals, in the case of memory elements between several processes involving primary input/output ports,
insertion of HDL instructions in each process, so as to obtain at least one so-called "SCAN" chain during synthesis of the circuit, connecting memory elements specific to the process,
insertion of HDL instructions providing concurrent assignment of input and output chains of SCAN chains external to processes.

According to the invention, the method of analysing and inserting HDL instructions may be used within the framework of different HDL description languages such as Verilog or VHDL, it being understood that these are non-limitative examples and that the process according to the invention can be used for other HDL description languages.

Furthermore, the process can also be used on a heterogeneous set of original HDL language description files for example but not exclusively comprising some description files produced in the Verilog language and other description files produced in the VHDL language.

Thus, according to another characteristic of the invention, when Verilog and VHDL languages are used as HDL description languages, the step to localise HDL instructions at the origin of memory elements includes:
a step to search for synchronized processes to detect objects assigned within these processes,
application of the following rules for identification of instructions at the origin of memory elements:
any object assigned within one process and that is read in another process or in the concurrent part of the HDL code will be considered as being a memory element,
in a synchronized process, any object assigned within one branch of an "if" control structure without being assigned within all other branches of this same structure is considered to be a memory element,
in a synchronized process, any object that is read before it is written is considered to be a memory element.

In one preferred embodiment of the process according to the invention and within the framework of local chaining of a process described in the VHDL language, a phase is included to insert VHDL instructions for the definition of intermediate signals designed to reuse values of chains of variable strings, to enable assignment and chaining of these chains external to the processes.

Furthermore, according to the invention, automatic insertion of HDL instructions must be done in such a way as to not induce any functional degradation of the code of the original integrated digital electronic system in the HDL language.

According to another characteristic of the invention, programmable SCAN chains are created so as to enable optimisation of SCAN chains and an improvement to the coverage of faults after synthesis of the integrated digital electronic system using the new set of HDL description files without it being necessary to modify the description in the HDL language again and to use the process according to the invention again, and thus to prevent an increase in the circuit design time. To achieve this, the step to insert HDL SCAN instructions includes a phase to insert HDL instructions that will generate a programmable multiplexer during the synthesis inserted between at least some of the memory elements of a SCAN chain. Preferably, such a multiplexer is inserted between all successive memory elements of the SCAN chains. Obviously, HDL instructions corresponding to a controller of the multiplexers inserted in SCAN chains are also inserted.

It should be noted that the different characteristics of the method according to the invention like those described above may be combined in different combinations when these characteristics are not incompatible with each other.

The invention also relates to an integrated digital electronic system or single chip system that includes at least one functional combinational logic module and associated memory elements and SCAN type test means including at least one chain of memory elements. According to the invention, the integrated digital electronic system is characterized in that it includes means for programmable reconfiguration of the SCAN chain.

According to another characteristic of the invention, once again so as to improve the test capacities of the circuit that will be obtained from the new HDL description file set, the process includes a step to insert HDL instructions which will be synthesized to create built-in system tests (BIST) of the integrated digital electronic system. Such means include at least one automatic Test Pattern Generator (TPG), means of analysing the response of the electronic system and the test control means. According to one preferred characteristic of the invention, the automatic test pattern generator includes a linear Parallel Random Pattern Generator (PRPG) and is designed such that the initialisation sequence of the parallel random pattern generator is programmable. Furthermore, according to one preferred embodiment of the invention, the test pattern generating structure and the response analysis structure are based on the programmable or reconfigurable SCAN structure mentioned above.

The different characteristics of an integrated digital system according to the invention as mentioned above may be combined with each other according to different combinations when these characteristics are not incompatible with each other.

The invention also relates to an automated design device in a description language at the register transfer level, called the HDL language, of a complete system or part of an integrated digital electronic system, this device comprising at least one calculation unit, a memory unit and a file storage unit, characterized in that the storage unit includes HDL language description files of the system or part of the integrated electronic system and in that the calculation and memory units are adapted to generate new HDL description files of the system or part of this system that include HDL descriptions, using the method according to the invention and starting from HDL description files, such that the system or part of the integrated digital electronic system obtained from the new files includes at least part of the electronic logic circuits necessary for the operational test of at least the memory elements.

In one preferred embodiment, the device includes a personal computer using a program which is executed to use the process according to the invention.

The invention also relates to a data support that can be read by the computer on which a program is recorded, which when executed by a computer enables use of the method according to the invention.

Various other characteristics of the invention will become clear from the following description made with reference to the appended drawings that show different purposes of the invention in non-limitative forms provided as examples.

FIG. 1 shows an example flowchart for use of the method according to the invention.

FIG. 2 shows an original description file of a portion of an integrated digital system, in the VHDL language.

FIG. 3 shows an example file generated during use of the method according to the invention, on the file in FIG. 2.

FIG. 4 shows an original description file of a portion of an integrated digital system, in the Verilog language.

FIG. 5 shows an example file generated during use of the process according to the invention, on the file in FIG. 4.

FIGS. 6 and 7 show examples of indexing files of memory elements generated by the method according to the invention for files according to FIGS. 2 and 4.

FIGS. 8 and 9 show HDL description files corresponding to the original files in FIGS. 2 and 4 respectively, incorporating HDL SCAN instructions automatically inserted by the method according to the invention.

Figure 10:
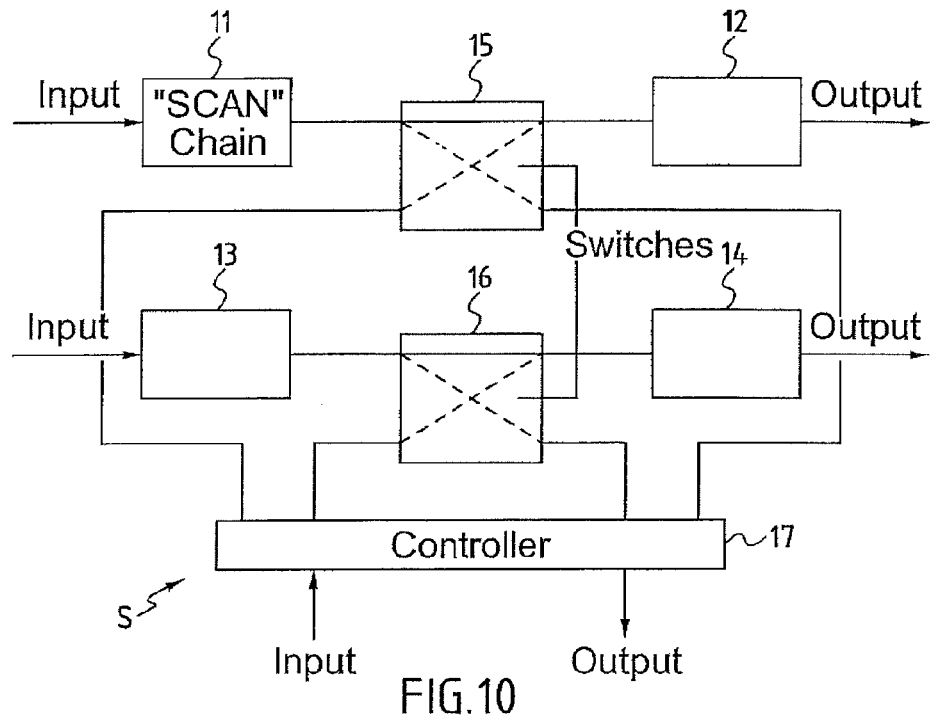

FIG. 10 diagrammatically shows use of means of reconfiguring SCAN chains of an integrated digital system.

Figure 11:
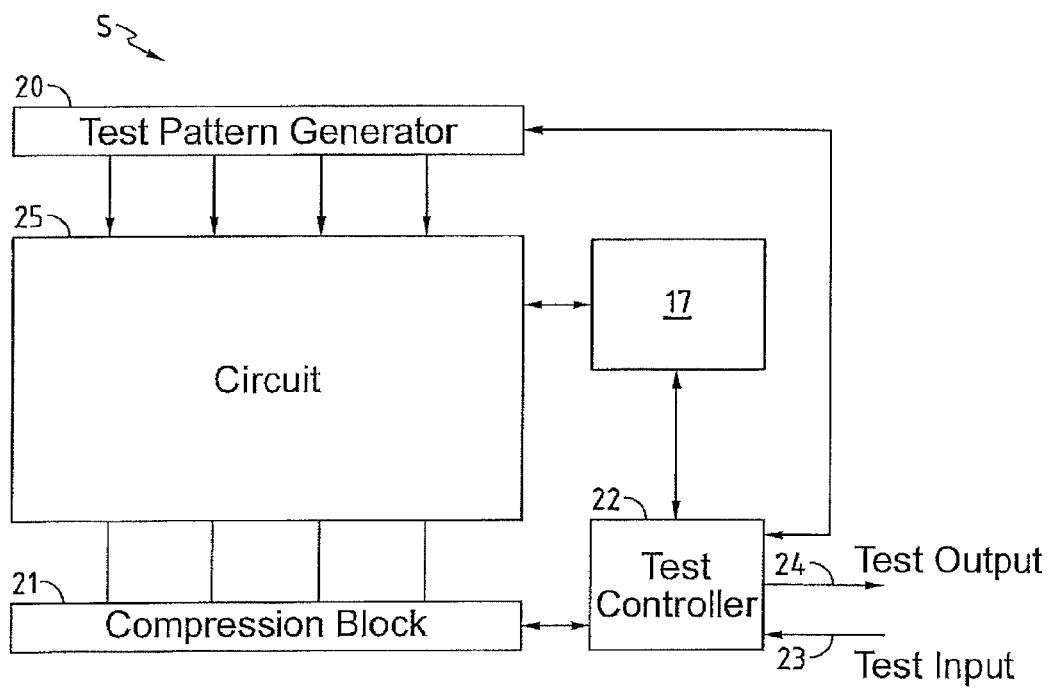

FIG. 11 diagrammatically shows an integrated digital system like that obtained after synthesis of an HDL description generated by the process according to the invention and using built-in self-test "BIST" functions.

As previously mentioned, a first embodiment of the method according to the invention is intended to insert an HDL instruction circuit at the HDL language description, that after synthesis of the circuit will provide the circuit with all means necessary to test at least part of its memory elements using the SCAN technique. The invention is intended to achieve this purpose without making any prospective analysis of the circuit such as a relational or functional analysis requiring expensive calculation resources and introducing long processing times. On the other hand, according to the invention, instructions corresponding to SCAN chains and associated functions are inserted as memory elements or HDL instructions corresponding to memory elements occur. Obviously, according to the invention, this chaining is done by testing that the SCAN chain(s) being produced satisfy criteria imposed by the user if any, while progress is being made, and any necessary corrections are made by taking action on the chains and/or chain segments already produced.

In one preferred embodiment, the method according to the invention shown in the flowchart in FIG. 1, includes firstly a step 1 for automatic localisation of the instructions that will be at the origin of memory elements during synthesis of the system.

This automatic localisation may involve several phases and in one preferred embodiment, the automatic localisation step includes a step 1a for analysis or indexing of all original description files in order to create at least one VIF indexing file containing the list of design units if they exist (entity, library, packet), and all declarations for each design unit, each declaration including the line number, the object name, type, size and the associated control construction type. This indexing file will then contain at least the type and coordinates in the original or initial HDL description files, for each HDL object and process.

Figure 2:
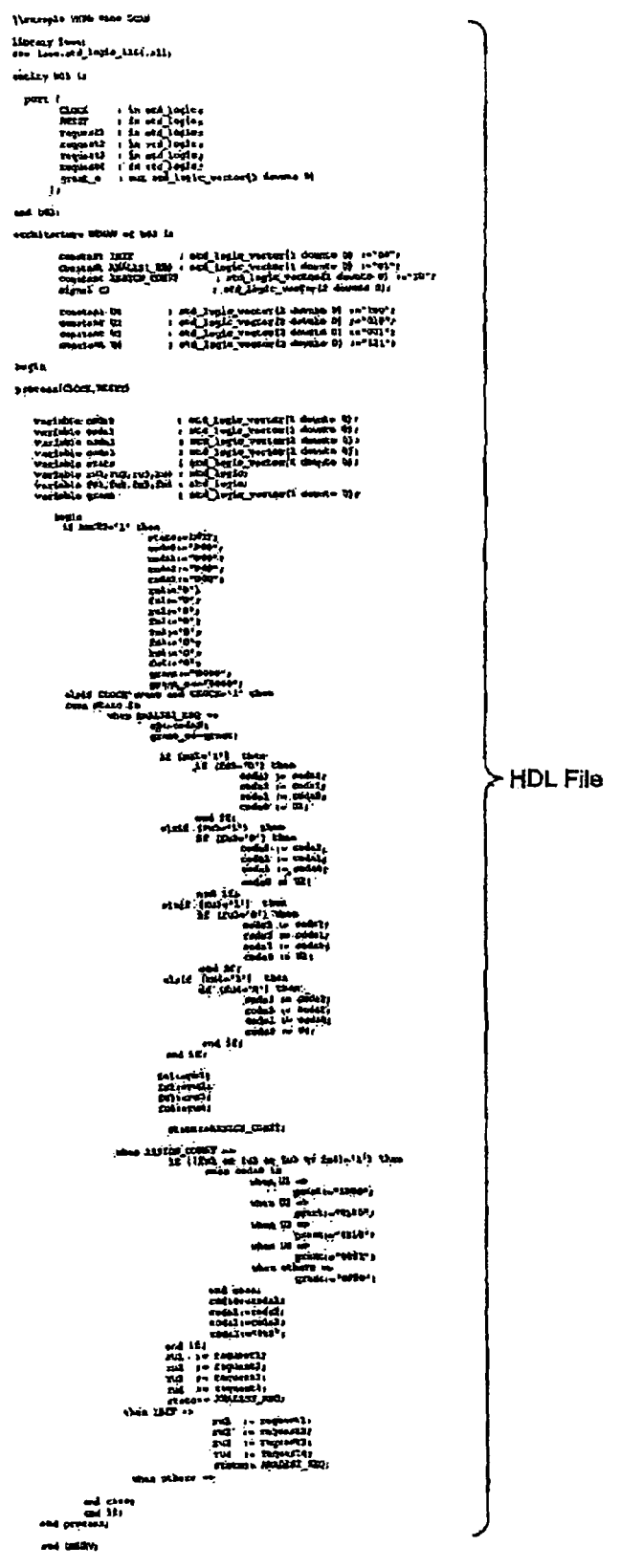
Figure 3:
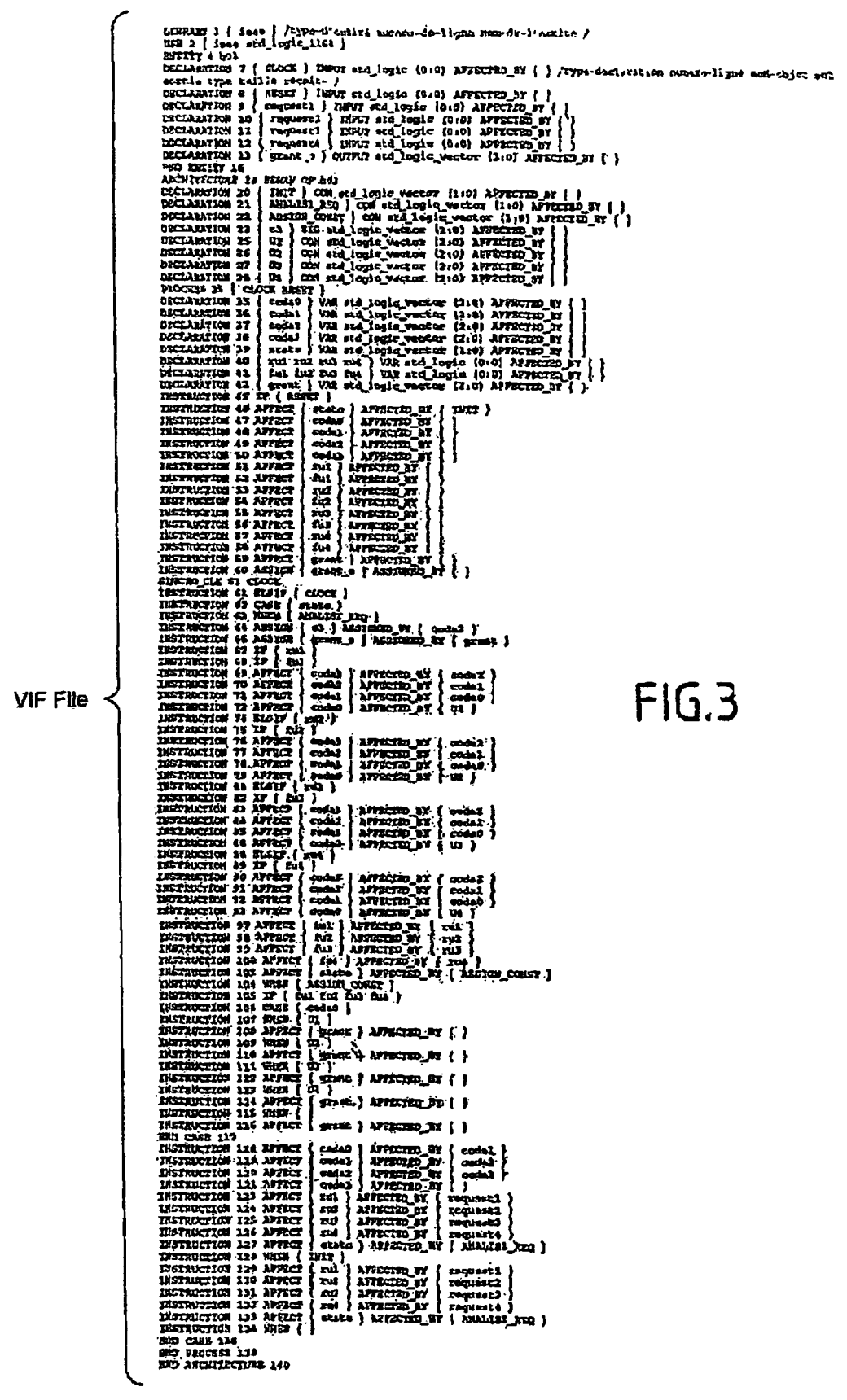

A VIF indexing file like that shown in FIG. 3 is generated within the framework of this analysis or indexing step 1a for example done starting from a description file for a process in the VHDL language like that shown in FIG. 2.

According to the invention, this analysis or indexing step 1a may be carried out for other types of HDL language. Thus, FIG. 4 shows an example original or initial description file in the VERILOG language based on several processes and the indexing step 1a applied to this file will be used to obtain a VIF indexing file like that shown in FIG. 5.

It should be noted that according to the invention, the indexing step 1a may lead to the creation of several indexing files, an indexing file system and preferably but not strictly necessarily, the creation of an indexing database.

Within the framework of the indexing step, the method according to the invention includes indexing of identical instances that might be present in the HDL description of the system, in addition to indexing of the different elementary instructions. Identical instances means a single file or a single set of HDL files describing the part of the system that is used several times in the system.

After this indexing step 1a, there is a step 1b for automatically localising HDL instructions that will be the origin of memory elements after synthesis of the circuit. According to the invention, this localisation step 1b is used for the different types of HDL description language, for example but not exclusively VHDL and Verilog languages that may also be used in combination to describe a single system. Some parts of this system may thus be described by files written in the VHDL, while other parts of the system are described by files written in Verilog.

In its preferred embodiment and for use in VHDL or Verilog files, the step 1b for localising HDL instructions at the origin of memory elements includes a step to search for synchronized processes so as to detect objects assigned within these processes. This step to search for synchronized processes is made from the result of the indexing step 1a, namely by processing of VIF Files or data from the database created or defined during this step 1a and possibly by processing of the initial HDL description files for the system, in the HDL language. After localisation of the synchronized processes, instructions that might generate memory elements during synthesis are identified using the following rules:

any object assigned within one process and that is read in another process or in a concurrent part of the HDL code will be considered as being at the origin of a memory element and in a synchronized process, any object assigned within one branch of an "if" control structure without being assigned within all the other branches of this structure is considered as being at the origin of a memory element;

in a synchronized process, any object that is read before being written is referenced as being at the origin of a memory element.

The step to identify the localisation step 1b is carried out using the result of the indexing step 1a, like the step to search for synchronized processes, namely by a processing of VIF Files or data in the database created or defined during this step 1a and possibly by processing of initial HLD description Files for the system, in the HDL language. The localisation step 1b also includes a step to write or create a MEM File that lists at least the name of the corresponding HDL object and its type, dimension and coordinates in the original HDL description files, for each memory element. FIG. 6 shows the localisation file for MEM File memory elements obtained for the HDL description file in the VHDL language according to FIG. 2, by processing of the VIF indexing File in FIG. 3. Similarly, FIG. 7 shows the localisation file for MEM File memory elements obtained for the HDL description File in the Verilog language according to FIG. 4 by processing of the VIF indexing File in FIG. 5. Obviously, according to the invention, the step to create one or a set of localisation files such as the MEM Files may equally apply to the creation of a database and to filling in a database with information on each memory element as listed non-limitatively above.

Another purpose of the invention is to overcome the lack of a certain amount of information related to the dimensions of some original HDL description file variables by including either a step to automatically choose the value of the missing dimension based on a default value predetermined by the user before or during use of the process according to the invention, or an interactive definition step with the user of the method as this lack of information occurs, depending on the choice of the user. The values of the dimensions thus defined are then recorded in MEM localisation Files or in the corresponding database(s).

According to one essential characteristic of the invention, the method includes an insertion step 2 to insert HDL instructions in at least part of the original HDL description file(s) of the system in the HDL language, after the localisation of HDL instructions that will be at the origin of memory elements during the synthesis, and during synthesis of the system, these instructions will be used to obtain at least one SCAN chain, and means of performing the SCAN test, for example but not exclusively such as SCAN inputs and outputs, means of putting the system into test mode, a SCAN test clock and a SCAN test controller.

HDL instructions for the SCAN will be inserted so as to prevent any violation of SCAN rules during synthesis of the circuit. The method according to the invention will then preferably include a phase to identify any different existing clock domains accompanied by a record in the files or the ad-hoc localisation database of the different clock domains, if applicable.

Preferably, the step 2 to insert HDL SCAN instructions is done as a function of parameters fixed by the user, namely the number and length of SCAN chains for the entire system or for some elements of the systems concerned.

Thus, the insertion step 2 will use the result of the localisation step 1 such as the MEM File, the original HDL description files, localisation of the different clock domains and SCAN usage parameters defined by the user.

According to the invention, HDL memory element chaining instructions are inserted locally at first and then globally.

The local chaining phase, repeated as many times as necessary, relates to the insertion of HDL chaining instructions at the overall HDL instruction level corresponding to an HDL process, so as to obtain at least one chain of memory elements for each HDL process, during the synthesis. In this respect, within the framework of local chaining of a process described in the VHDL language, the invention includes a phase to insert VHDL definition instructions for intermediate signals designed to reuse variable chains so as to enable their assignment and chaining outside processes.

Thus according to one preferred embodiment of the invention, the phase for automatic insertion of HDL instructions for local chaining includes the following phases:

insertion of HDL instructions corresponding to test signals used as an input-output port, possible insertion of HDL instructions corresponding to intermediate work signals, insertion of HDL instructions in each process, to obtain at least one chain called the "SCAN" chain during synthesis of the circuit, linking the memory elements specific to the process, insertion of HDL instructions for concurrent assignment of input and output chains of the SCAN chains external to processes.

It should be noted that in order to respect SCAN rules, the invention requires a verification of the compatibility of memory elements with each other when HDL chaining instructions are inserted, and to achieve this, the step to insert HDL chaining instructions includes either a phase for automatic transformation of the type and/or dimension of one or both objects at the origin of the conflict, or an interactive modification phase with the user of the type and/or dimension of one or both of the objects at the origin of the conflict.

Global chaining occurs after local chaining, and includes a phase repeated as many times as necessary to insert an HDL global chaining instructions in the HDL description files so as to obtain at least one chain of memory elements during the synthesis, comprising memory element chains created during the local chaining phase.

Figure 8:
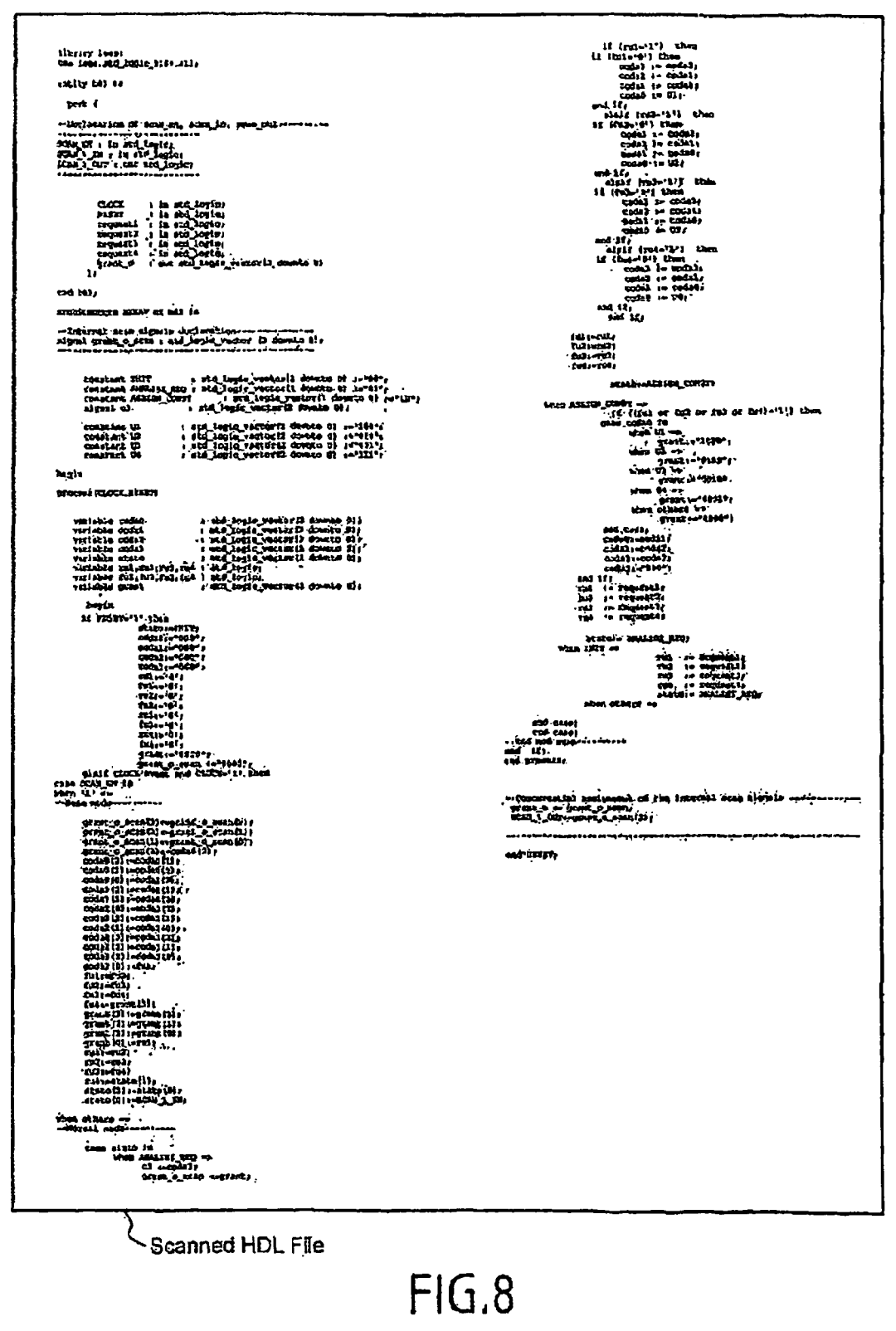
Figure 9:
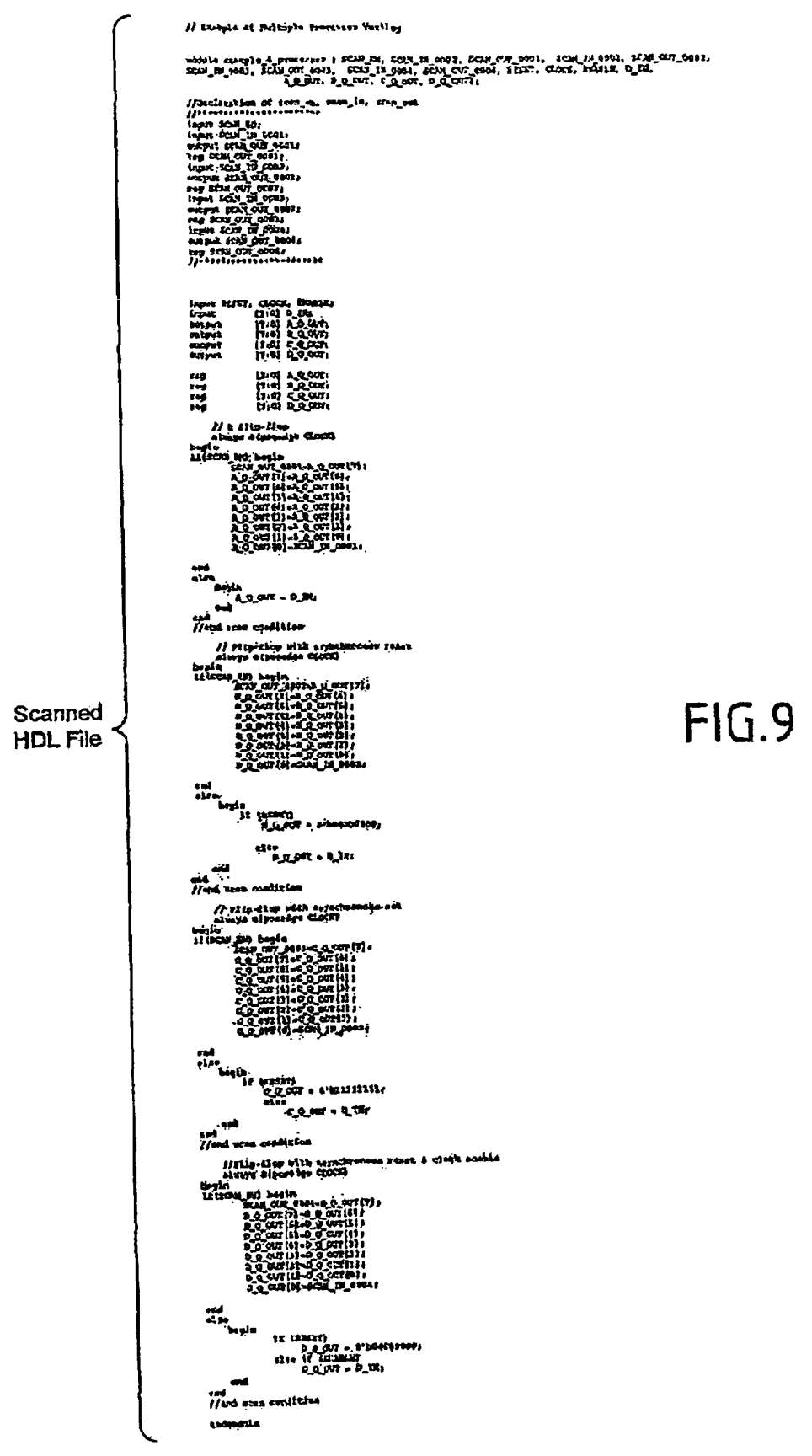

Thus, when the method according to the invention is used, the result is the SCANNED HDL File shown in FIG. 8, produced from the original VHDL HDL file shown in FIG. 2, containing a VHDL description of the same system containing VHDL instructions that will be at the origin of the SCAN functions during the synthesis. Similarly, FIG. 9 shows the Verilog Scanned HDL description File obtained by use of the process according to the invention on the original Verilog description file as shown in FIG. 4.

It should be noted that the method according to the invention is preferably used so as to take account firstly of the existence, of identical instances such as instances indexed during the indexing step 1a, and secondly the user's choices that may for example result in an instance in part of the system being concerned by a single SCAN chain, while the same instance in another part of the system is concerned by several SCAN chains, it being understood that these two or multiple identical instances should be described by the same file or set of HDL files. The invention thus proposes to satisfy this requirement by modifying the instance by automatic insertion of SCAN HDL instructions when it appears for the first time during automatic insertion of SCAN HDL instructions for the set of system description files. Then, whenever the said instance is encountered again, a check is made that the SCAN HDL instructions can be used to satisfy local SCAN constraints, and if this is the case no modification is made to description files of the instance. On the other hand if this is not the case, the description file(s) of the instance is (are) modified and all previous locations in which the said instance occurred are verified and its environment is modified so as to satisfy local SCAN constraints with the new form of the instance. This method of proceeding, in accordance with the spirit of the invention, avoids any predictive analysis calculation on identical instances and reconsiders insertions of HDL instructions already made, only when necessary.

In one variant embodiment of the method, the invention proposes to enable a designer to change his mind about the choice related to the configuration of SCAN chains that are built at RTL level. To achieve this, the invention proposes to insert HDL reconfiguration instructions in addition to SCAN HDL instructions, namely firstly HDL instructions that define intermediate switches inserted between each memory element of a SCAN chain and/or between parts of SCAN chains, and secondly HDL instructions corresponding to at least a controller of these intermediate switches.

HDL SCAN and reconfiguration instructions will be used to make an integrated digital system S with functions like those schematically shown in FIG. 10, during synthesis. Thus, the system S includes SCAN chain portions 11, 12, 13, 14 connected to each other one after the other as shown in FIG. 10, by intermediate switches 15, 16 connected to a controller 17.

In using these means, it becomes possible to dynamically reconfigure SCAN chains after synthesis at hardware level by redefining the following parameters:
  size of SCAN chains
  physical configuration of one or several SCAN chains.

As shown in FIG. 10, such a reconfiguration requires a controller 17 that acts on the switches 15, 16 to activate connections of portions of chains 11 to 14 to each other and with the controller 17 depending on the configuration sequence activated at the controller.

In one embodiment, the invention also includes a step for automatic insertion of HDL instructions into the HDL description files of the system, and after synthesis of the system these HDL instructions will provide it with all Built-In Self-Test (BIST) functions.

Thus, the invention includes a step to automatically insert built-in HDL self-test instructions that will be at the origin of at least the following during the synthesis:
  test pattern generation means such as a test pattern generator 20,
  means of analysing the response of the tested circuit such as a test result compression block 21,
  test control means such as a test controller 22,
  a test input 23 and output 24.

As shown in FIG. 11, these elements relate to the circuit 25 to be tested that can perform all or only part of the functions of the system S.

According to the invention, the test controller will be adapted to enable at least programming of the initialisation sequence or sequences of the test generator so as to increase the reliability of the built-in self-test and particularly fault coverage. The test controller will be adapted to enable programming of the test controller configuration and possibly programming of the SCAN controller, ion order to further increase the fault coverage.

According to another characteristic of the invention, there is a step after the synthesis to program the test controller and possibly the SCAN controller, this programming can then be made at a low level on the test controller so as to fix its test parameters.

Obviously, various modifications to the invention can be made without going outside its scope.

The invention claimed is:

1. Method for analyzing a set of original description files for an integrated digital electronic system (5) in a description language called high level description (HDL) language, at the register transfer level, in order to automatically insert instructions in the HDL language into description files to obtain a new set of description files in the HDL language for the integrated digital electronic system including test functions such that during automatic synthesis of the integrated digital electronic system using a new set of files, the integrated digital electronic system obtained builds in at least some of the logical electronic circuits (22, 23, 24) necessary to test the integrated digital electronic system (5), method characterized in that it includes the following steps:
  employing a processor for automatic localization (1) of HDL instruction sequences that will be at the origin of the memory elements during synthesis of the system (3), in the original HDL description files;
  using said processor for automatic and sequential insertion in at least part of HDL description files, and without relational or functional analysis of the identified memory elements, of scan HDL instructions used to obtain at least one scan chain (11) connecting the memory elements, during synthesis of the system (3); and further
  in that it includes a step (1a) using said processor for analysis or indexing of all original HDL description files and creation of at least one indexing file containing the list of design units if they exist (entity, library, packet), for each object and HDL process, and all declarations for each design unit, each declaration including the line number, the object name, type, size and the associated control construction type;
  and in that the step (1b) for localizing HDL instructions that will be at the origin of memory elements during synthesis of the circuit, includes a phase to create a memo localization file comprising, for each memory element, the name of the corresponding HDL object, its type, dimension and coordinates in the original HDL description files.

2. Analysis and insertion method according to claim 1, characterized in that it includes a step to record the new set of HDL description files obtained.

3. Analysis and insertion method according to claim 1, characterized in that the step (1) for localizing HDL instructions at the origin of the memory elements includes:
  a step to search for synchronized processes to detect objects assigned within these processes, and application of the following rules for identification of instructions at the origin of memory elements:
  any object assigned within one process and that is read in another process or in the concurrent part of the HDL code will be considered as being a memory element,
  in a synchronized process, any object assigned within one branch of an "if" control structure without being assigned within all other branches of this same structure is considered to be a memory element,
  in a synchronized process, any object that is read before it is written is considered to be a memory element.

4. Analysis and insertion method, according to claim 1, characterized in that it includes a step to identify any different existing clock domains, and in that the step to insert HDL memory element chaining instructions is carried out so as to create at least one distinct scan chain for each clock domain.

5. Analysis and automatic insertion method according to claim 1, characterized in that the analysis or indexing step includes an indexing step of identical instances of the system and in that the step for automatically inserting the scan instructions is performed for each instance when it appears for the first time during automatic insertion of SCAN HDL instructions for all description files in the system, then, whenever the said instance is encountered again, a check is made that the scan HDL instructions can be used to satisfy local scan constraints, and if this is the case, no modification is made to description files of the instance, on the other hand if this is not the case, the description file(s) of the instance is (are) modified and all previous locations in which the said instance occurred are verified and its environment is modified so as to satisfy local SCAN constraints with the new form of the instance.

6. Analysis and automatic insertion method according to claim 1, characterized in that, in the case of a lack of information related to the dimension of a variable at the origin of a memory element in the original HDL description files, it includes either a step to automatically define this value based on a predetermined default value, or a step in which a user of the method makes the definition interactively.

7. Analysis and automatic insertion method according to claim 1, characterized in that it includes:
  a step to verify the compatibility of memory elements with each other, when inserting the HDL chaining instructions,
  and in case of incompatibility:
    either a phase for automatic transformation of the type and/or dimension of one of the two objects at the origin of the conflict,
    or a phase in which the user interactively modifies the type and/or the dimension of one of the two objects at the origin of the conflict.

8. Analysis and automatic insertion method according to claim 1, characterized in that the HDL instruction insertion step for chaining of memory elements includes:
  a phase to insert HDL chaining instructions of memory elements, called local chaining, in the set of HDL instructions corresponding to an HDL object so as to obtain at least one distinct chain of memory elements for each HDL object during the synthesis,
  a phase to insert HDL chaining instructions, called global chaining, in the HDL description files, so as to obtain at least one chain of memory elements during the synthesis, comprising the chains of memory elements created during the local chaining phase.

9. Analysis and automatic insertion method according to claim 8, characterized in that the step for automatic insertion of the HDL instructions for local chaining includes the following phases:
  insertion of HDL instructions corresponding to test signals used as an input-output port,
  insertion of HDL instructions corresponding to intermediate work signals, in the case of memory elements between several processes involving primary input/output ports,
  insertion of HDL instructions in each process, so as to obtain at least one scan chain during synthesis of the circuit, connecting memory elements specific to the process,
  insertion of HDL instructions providing concurrent assignment of input and output chains of scan chains external to processes.

10. Analysis and automatic insertion method according to claim 1, characterized in that in order to enable reconfiguration of scan chains after synthesis, the step to insert HDL scan instructions includes:
  a phase to insert HDL instructions that will generate intermediate switches inserted between some at least of the memory elements of a scan chain, during synthesis,
  a phase to insert HDL instructions that will generate a controller of these intermediate switches, during synthesis.

11. Analysis and automatic insertion method according to claim 1, characterized in that the step for automatic insertion of HDL instructions includes a step for insertion of built-in self-test HDL instructions which will be at the origin of at least the following during the synthesis:
  test pattern generation means such as a test pattern generator (20),
  means of analyzing the response of the tested circuit such as a test result compression block (21),
  test control means such as a test controller (22),
  a test input (23) and output (24).

12. Analysis and automatic insertion method according to claim 11, characterized in that the means for generating test patterns include a linear Parallel Random Pattern Generator (PRPG) for which the initialization sequence is programmable.

13. Analysis and automatic insertion method according to claim 12, characterized in that means for generating test patterns and analyzing responses are based on the reconfigurable scan structure.

14. Device for automated design of a complete system or part of an integrated digital electronic system (5) in a description language at the register transfer level, called the HDL language, this device including at least one calculation unit, a memory unit, and a file storage unit, characterized in that the storage unit includes HDL language description files of the system or part of the integrated electronic system and in that the calculation and memory units are adapted to generate new HDL description files of the system or part of this system that include HDL descriptions, using the method according to claim 1, and starting from HDL description files, such that the system or part of the integrated digital electronic system obtained from the new files includes at least part of the electronic logic circuits necessary for the operational test of the memory elements.

15. Integrated digital electronic system, characterized in that it results from the synthesis of a set of description files in the HDL language obtained by use of the method according to claim 1 and in that it includes at least part of the logical electronic circuits necessary to test operation of the memory elements, such as one or several scan chains.

16. Integrated digital electronic system according to claim 15, characterized in that it is adapted to enable reconfiguration of the scan chains and in that it includes at least:

intermediate switches (15, 16) placed between at least some of the memory elements (11, 12) in a scan chain;

and an intermediate switch controller.

17. Integrated digital electronic system according to claim 15, characterized in that it includes:

test pattern generation means such as a test pattern generator (20), means of analyzing the response of the tested circuit such as a test result compression block (21), test control means such as a test controller (22), a test input (23) and output (24).

18. Integrated digital electronic system according to claim 17, characterized in that the means for generating test patterns include a linear Parallel Random Pattern Generator (PRPG) for which the initialization sequence is programmable.

19. Integrated digital electronic system according to claim 18, characterized in that the means for generating test patterns and analyzing responses are based on the reconfigurable scan structure.

* * * * *